(12) United States Patent
Krishnamoorthy et al.

(10) Patent No.: US 8,659,161 B2
(45) Date of Patent: Feb. 25, 2014

(54) CHIP PACKAGE WITH REINFORCED POSITIVE ALIGNMENT FEATURES

(75) Inventors: Ashok V. Krishnamoorthy, San Diego, CA (US); Craig A. Stephen, San Francisco, CA (US); John E. Cunningham, San Diego, CA (US); James G. Mitchell, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 143 days.

(21) Appl. No.: 13/165,599

(22) Filed: Jun. 21, 2011

(65) Prior Publication Data

US 2012/0326322 A1    Dec. 27, 2012

(51) Int. Cl.
    *H01L 23/48*    (2006.01)
(52) U.S. Cl.
    USPC ........... 257/773; 257/686; 257/737; 257/738; 257/E23.01
(58) Field of Classification Search
    USPC ...................... 257/773, 686, 737, 738, E23.01
    See application file for complete search history.

(56) References Cited

U.S. PATENT DOCUMENTS 6,159,768 A * 12/2000 Ahn .............................. 438/107

OTHER PUBLICATIONS

Krishnamoorthy, Ashok V. et al., "Computer System Based on Silicon Photonic Interconnects", vol. 97, No. 7, Jul. 2009, Proceedings of the IEEE, pp. 1337-1361.
Majumdar, Arka et al., "Alignment and Performance Considerations for Capacitive, Inductive, and Optical Proximity Communication", IEEE Transactions on Advanced Packaging, vol. 33, No. 3, Aug. 2010.

* cited by examiner

*Primary Examiner* — Long Pham
(74) *Attorney, Agent, or Firm* — Park, Vaughan, Fleming & Dowler LLP; Steven E. Stupp

(57) ABSTRACT

A chip package includes a substrate having a positive feature, which is defined on a surface of the substrate and which protrudes above a region on the surface proximate to the positive feature. Furthermore, the chip package includes a mechanical reinforcement mechanism defined on the substrate proximate to the positive feature that increases a lateral shear strength of the positive feature relative to the substrate. In this way, the chip package may facilitate increased reliability of a multi-chip module (MCM) that includes the chip package.

17 Claims, 8 Drawing Sheets

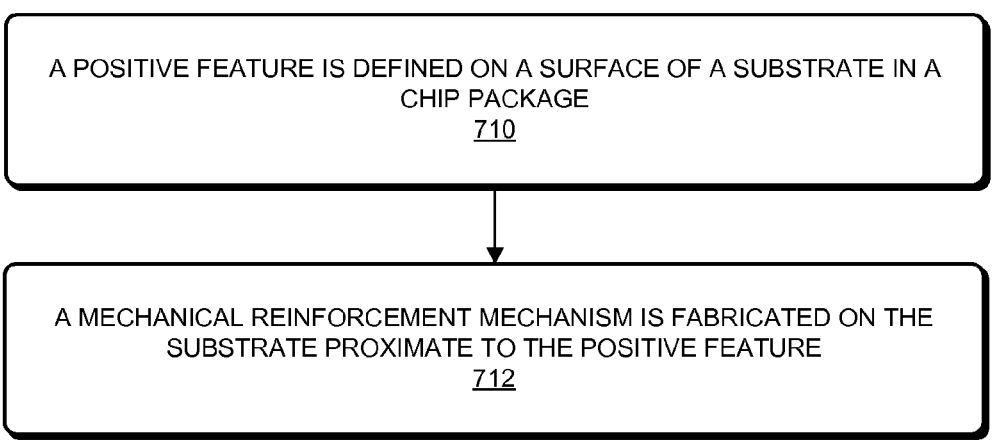

```
                                                                    ┌─ 700

┌─────────────────────────────────────────────────────────────────┐
│   A POSITIVE FEATURE IS DEFINED ON A SURFACE OF A SUBSTRATE IN A │
│                         CHIP PACKAGE                             │
│                             710                                  │
└─────────────────────────────────────────────────────────────────┘
                                 │
                                 ▼
┌─────────────────────────────────────────────────────────────────┐
│   A MECHANICAL REINFORCEMENT MECHANISM IS FABRICATED ON THE      │
│       SUBSTRATE PROXIMATE TO THE POSITIVE FEATURE                │
│                             712                                  │
└─────────────────────────────────────────────────────────────────┘
```

FIG. 7

CHIP PACKAGE WITH REINFORCED POSITIVE ALIGNMENT FEATURES

GOVERNMENT LICENSE RIGHTS

The United States Government has a paid-up license in this invention and the right in limited circumstances to require the patent owner to license others on reasonable terms as provided for by the terms of Agreement No. HR0011-08-9-0001 awarded by the Defense Advanced Research Projects Administration.

BACKGROUND

1. Field

The present disclosure generally relates to a chip package for semiconductor dies or chips. More specifically, the present disclosure relates to a chip package that includes mechanically reinforced positive features that facilitate alignment of semiconductor chips in a multi-chip module (MCM) that includes the chip package.

2. Related Art

As integrated-circuit (IC) technology continues to scale to smaller critical dimensions, it is increasingly difficult for existing interconnects to provide suitable communication characteristics, such as: high bandwidth, low power, reliability and low cost. Engineers and researchers are investigating chip stacking in multi-chip modules (MCMs) to address these problems, and to enable future high-density, high-performance systems.

However, it is difficult to bond chips to each other and to carriers (such as printed circuit boards) in chip stacks using existing assembly techniques because of stringent requirements for alignment accuracy and manufacturing throughput. For example, if chips are bonded to each other using a silicone-based adhesive, a pick-and-place tool and non-standard fixturing may be needed to obtain the desired alignment.

Alternatively or additionally, chips in an MCM may be assembled using positive and/or negative features, for example, using balls and pits, in which adjacent chips in the MCM are aligned by placing the balls into collocated pits on surfaces of the chips. This existing assembly technique can provide high alignment accuracy among the chips in the MCM. However, it typically involves multiple assembly operations, which makes assembly of the chip package complicated, time-consuming and expensive.

In addition, fabricating the positive and/or negative features can be challenging. For example, relative to features that are fabricated using an additive process (in which material is added), features that are fabricated using a subtractive process (in which material is removed) tend to be more structurally stable and, in general, are also able to withstand sufficient shear force to allow the features to make and to maintain alignment. However, many subtractive fabrication processes are incompatible with other semiconductor fabrication processes or may interfere with the function of a semiconductor wafer.

As a consequence, additive processes often are preferred when fabricating positive and negative features. However, because of poor adhesion to the substrates in the chips, the resulting 'additive' features often fail when subjected to lateral shear forces, such as those associated with different coefficients of thermal expansion and lateral misalignment of the chips in the MCM. Consequently, additive features are often unreliable, which can prevent them from properly aligning the chips in the MCM.

Hence, what is needed is a chip package without the above-described problems.

SUMMARY

One embodiment of the present disclosure provides a chip package that includes a substrate having a positive feature defined on a surface of the substrate, where the positive feature protrudes above a region on the surface proximate to the positive feature. Furthermore, the chip package includes a mechanical reinforcement mechanism defined on the substrate proximate to the positive feature that increases the shear strength of the positive feature relative to the substrate.

This positive feature may facilitate mechanical alignment between two components in a multi-chip module (MCM) that includes the chip package. For example, the mechanical alignment may be facilitated using only positive features. Note that the positive feature may have: a hemispherical shape, a truncated hemispherical shape, a rectangular shape, a pyramidal shape, and/or a truncated pyramidal shape. Moreover, the substrate may include: a semiconductor, an organic material, a ceramic, glass, and/or a plastic. In some embodiments, the positive feature is fabricated on the substrate using an additive fabrication process. Furthermore, a wide variety of materials may be used to fabricate the mechanical reinforcement mechanism, including: a patterned metal that is reflowed so it conforms to a shape of the positive feature, a semiconductor, and/or a cured material (such as an adhesive and/or an epoxy).

In some embodiments, the mechanical reinforcement mechanism is located at a base of the positive feature at an interface with the substrate. For example, the mechanical reinforcement mechanism may be located around a circumference of the positive feature. Alternatively or additionally, the chip package may include a metal/dielectric stack defined on the surface. The positive feature may be located in an opening, defined by an edge, in the metal/dielectric stack, and the mechanical reinforcement mechanism may be located in the opening between a side of the positive feature and the edge.

In some embodiments, the positive feature may include a material that can be reflowed during assembly of an MCM to align and rigidly mechanically couple two components in the MCM. Alternatively or additionally, the positive feature may include a material that can be partially melted during assembly of the MCM to align and rigidly mechanically couple two components in the MCM. Thus, the material may be modified during assembly of the MCM.

Another embodiment provides the MCM that includes the chip package. This MCM may include a second substrate, where the positive feature facilitates mechanical alignment between the substrate and the second substrate. For example, the second substrate may include a negative feature defined on a second surface of the second substrate. This negative feature may be recessed below a region on the second surface proximate to the negative feature, and the positive feature may mate with the negative feature.

Alternatively or additionally, the second substrate may include a second positive feature defined on a second surface of the second substrate, where the second positive feature protrudes above a region on the second surface proximate to the second positive feature. Moreover, the second substrate may include a second mechanical reinforcement mechanism defined on the second substrate proximate to the second positive feature, where the second mechanical reinforcement mechanism increases the shear strength of the second positive feature relative to the second substrate. Furthermore, alignment between the substrate and the second substrate may be facilitated by the positive feature and the second positive feature.

Another embodiment provides a method for increasing the shear strength in the chip package. During this method, the positive feature is defined on the surface of the substrate in the chip package, where the positive feature protrudes above the region on the surface proximate to the positive feature. Then, the mechanical reinforcement mechanism is fabricated on the substrate proximate to the positive feature, where the mechanical reinforcement mechanism increases the shear strength of the positive feature relative to the substrate.

BRIEF DESCRIPTION OF THE FIGURES

FIG. 7 is a flow diagram illustrating a method for increasing the shear strength in a chip package in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a chip package, a multi-chip module (MCM) that includes the chip package, an electronic device that includes the MCM, and a technique for increasing a lateral shear strength of the chip package are described. This chip package includes a substrate having a positive feature, which is defined on a surface of the substrate and which protrudes above a region on the surface proximate to the positive feature. Furthermore, the chip package includes a mechanical reinforcement mechanism defined on the substrate proximate to the positive feature that increases the shear strength of the positive feature relative to the substrate (and, more generally, the structural integrity of the positive features). In this way, the chip package may facilitate increased reliability of the MCM that includes the chip package.

By increasing the reliability of the MCM, the chip package may increase the yield of the MCM. Furthermore, the chip package may be used to: accurately align components, such as semiconductor dies or chips, in the MCM, thereby increasing manufacturing throughput. For example, the chip package may facilitate simultaneous alignment and assembly of multiple chips (such as two or more chips) in the MCM. Consequently, the chip package may facilitate lower-cost integration of multiple chips in the MCM, with commensurate improvements in performance.

Figure 1:
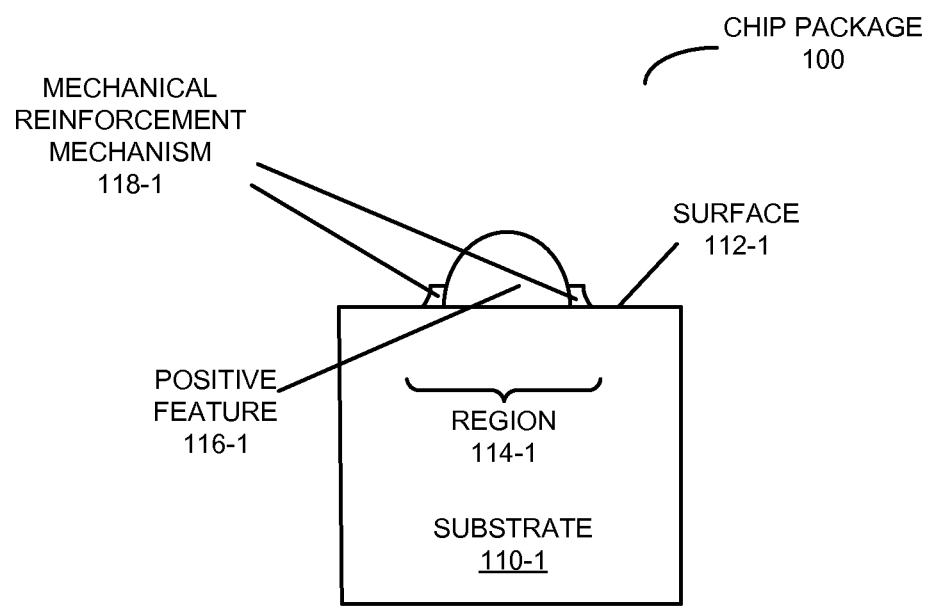
FIG. 1 is a block diagram illustrating a side view of a chip package in accordance with an embodiment of the present disclosure.

We now describe the chip package. FIG. 1 presents a block diagram illustrating a side view of a chip package 100. This chip package includes a substrate 110-1 having a positive feature 116-1 defined on a surface 112-1 of substrate 110-1, where positive feature 116-1 protrudes above a region 114-1 on surface 112-1 proximate to positive feature 116-1. Furthermore, chip package 100 includes a mechanical reinforcement mechanism 118-1 defined on substrate 110-1 proximate to positive feature 116-1 that increases the shear strength of positive feature 116-1 relative to substrate 110-1. This mechanical reinforcement mechanism can absorb stress, such as that associated with different coefficients of thermal expansion and lateral shear force, thereby increasing the reliability of positive feature 116-1.

Figure 2:
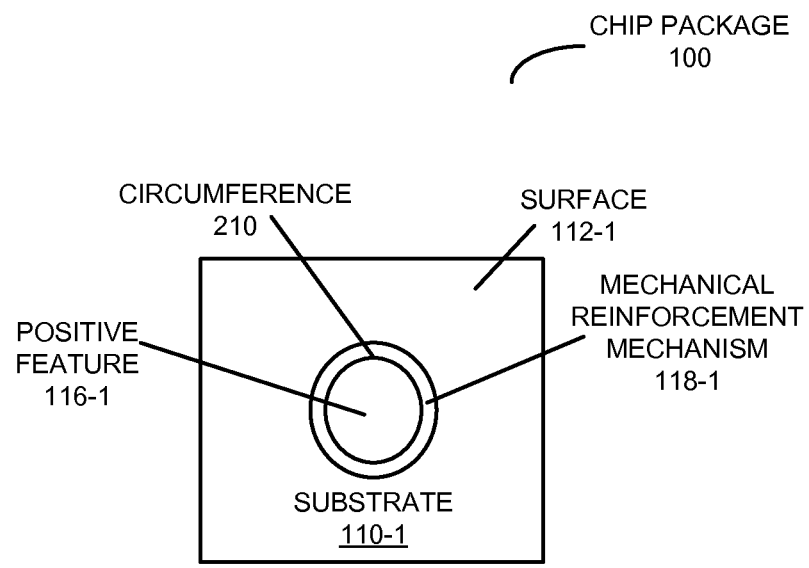
FIG. 2 is a block diagram illustrating a top view of the chip package in FIG. 1 in accordance with an embodiment of the present disclosure.

Mechanical reinforcement mechanism 118-1 may be located at a base of positive feature 116-1 at an interface with substrate 110-1. For example, as shown in FIG. 2, which presents a block diagram illustrating a top view of chip package 100, mechanical reinforcement mechanism 118-1 may be located around a circumference 210 of positive feature 116-1.

Positive feature 116-1 may have a variety of shapes, including: a hemispherical shape (such as microspheres or balls, spheres or hemispheres), a truncated hemispherical shape, a rectangular shape (such as a top hat), a pyramidal shape, and/or a truncated pyramidal shape. In the present discussion, a hemispherical shape is used as an illustration. In some embodiments, positive feature 116-1 is fabricated on substrate 110-1 using an additive fabrication process in which material is deposited or, more generally, added. However, in other embodiments a subtractive process, in which material is removed, is used either separately or in conjunction with the additive process.

Substrate 110-1 may include: a semiconductor (such as silicon or a silicon-on-insulator wafer), an organic material, a ceramic, glass, and/or a plastic. Furthermore, a wide variety of materials may be used to fabricate mechanical reinforcement mechanism 118-1, including: a patterned metal that is reflowed so it conforms to a shape of positive feature 116-1 (alternatively, the patterned metal may be deposited after fabrication of positive feature 116-1, thereby metalizing positive feature 116-1), a semiconductor, and/or a cured material (such as an adhesive and/or an epoxy). For example, positive feature 116-1 may be surrounded by the patterned metal, which can be melted after positive feature 116-1 is formed. Then, surface tension may force the melted liquid to conform to the surface(s) of the base of positive feature 116-1 and substrate 110-1.

Figure 3:
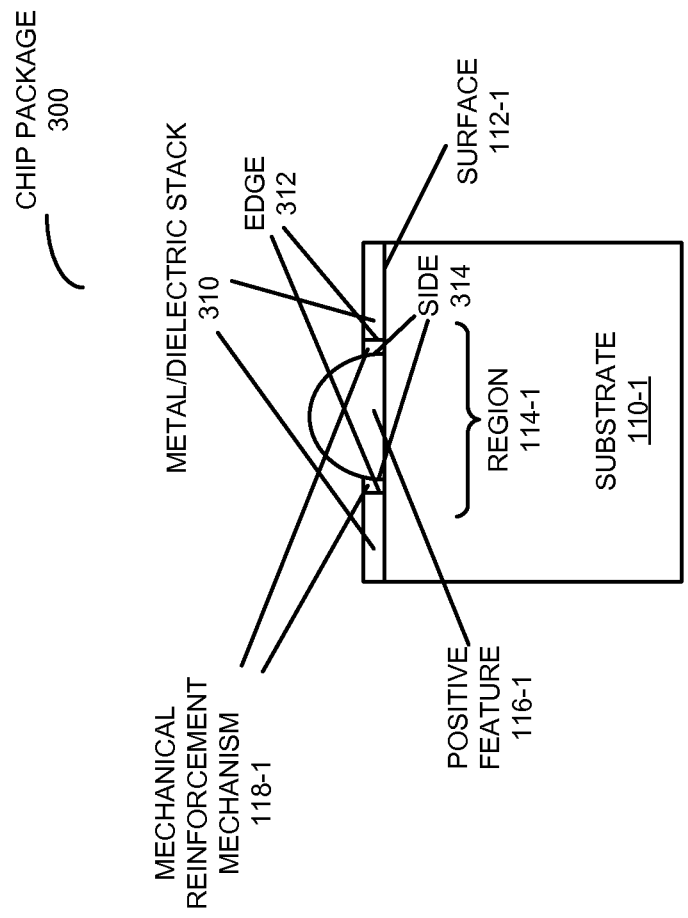
FIG. 3 is a block diagram illustrating a side view of a chip package in accordance with an embodiment of the present disclosure.

Alternatively or additionally, the mechanical reinforcement may not depend directly on adhesion to substrate 110-1. One approach is shown in FIG. 3, which presents a block diagram illustrating a side view of a chip package 300. In this chip package, a metal/dielectric stack 310 (i.e., the layers of metal connection layers and interlayer dielectrics that form the processed CMOS or other semiconductor wafer) may be defined on surface 112-1. Material may be removed from metal/dielectric stack 310, thereby creating an opening, defined by an edge 312. Then, positive feature 116-1 may be fabricated in the opening (including the metal, dielectric, photoresist, and/or other material), such that it protrudes from the opening but the base of positive feature 116-1 is contained within the opening. For example, metal/dielectric stack 310 may be approximately 10 µm thick, and can provide lateral support for a positive feature that is 50-100 µm high. Furthermore, mechanical reinforcement mechanism 118-1 (such as a metal) may be located in the opening between a side 314 of positive feature 116-1 and edge 312. Separately or additionally, mechanical support may be provided by an epoxy or adhesive that wicks around the base of positive feature 116-1, which is subsequently cured so that it is more firmly affixed to surface 112-1.

Note that the aforementioned mechanical-reinforcement techniques can be used separately or in conjunction with other each other. Moreover, by using one or more of these mechanical-reinforcement techniques, the Young's modulus of positive feature 116-1 may be increased from 100s of MPa before mechanical reinforcement to 100s of GPa with mechanical reinforcement.

Figure 4:
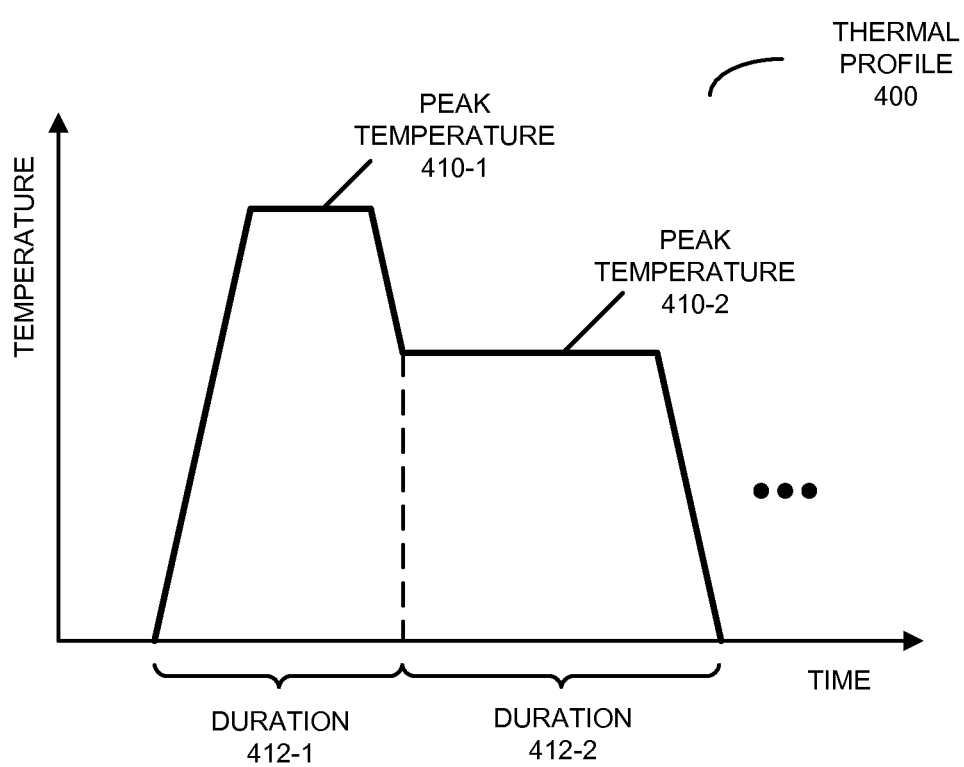
FIG. 4 is a timing diagram illustrating a thermal profile during fabrication of a chip package in accordance with an embodiment of the present disclosure.

In some embodiments, thermal processing is used to fabricate positive feature 116-1 and/or mechanical reinforcement mechanism 118-1. FIG. 4 is a timing diagram illustrating a thermal profile 400 during fabrication of a chip package. This thermal profile includes multiple peak temperatures 410 and associated durations 412. For example, the material, such as a photoresist (or, alternatively, a metal), for positive feature 116-1 may be deposited at temperatures between 180-200 C, and cured at temperatures between 100-200 C. Furthermore, it may be heated up to 200 C to reflow it into a hemispherical shape. Then, the material may be hard baked at the glass or polymer transition temperature (between 300-400 C). Note that, while FIG. 4 illustrates two peak temperatures 410 and durations 412, in other embodiments there may be additional or fewer peak temperatures 410 and durations 412.

Figure 5A:
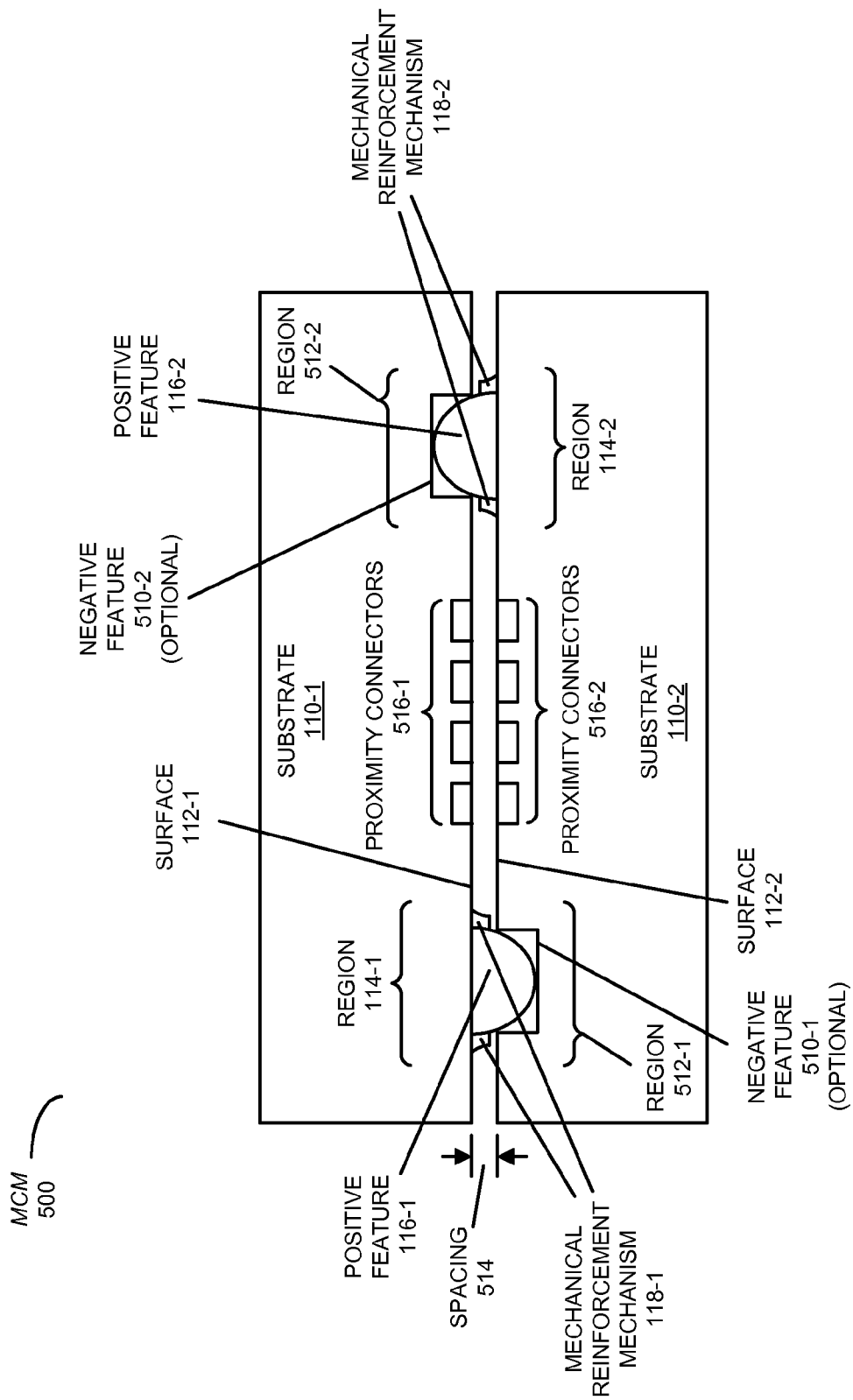
FIG. 5A is a block diagram illustrating a side view of a multi-chip module (MCM) in accordance with an embodiment of the present disclosure.

The preceding embodiments of the chip package may be used in a wide variety of applications. Notably, positive feature 116-1 may facilitate mechanical alignment between two components in an MCM that includes a chip package. This is shown in FIG. 5A, which presents a block diagram illustrating a side view of an MCM 500.

In particular, MCM 500 may include a substrate 110-2, where positive feature 116-1 facilitates mechanical alignment between substrate 110-1 and substrate 110-2. For example, substrate 110-2 may include an optional negative feature 510-1 defined on surface 112-2 of substrate 110-2. This optional negative feature may be recessed below a region 512-1 on surface 112-2 proximate to optional negative feature 510-1, and positive feature 116-1 may mate with optional negative feature 510-1 (such as ball-and-etch-pit structure), thereby aligning substrates 110. Note that spacing 514 between substrates 110 in this alignment technique can be independent of the so-called 'capture zone' of optional negative feature 510-1 (which may be a half radius of positive feature 116-1) by varying a depth of optional negative feature 510-1.

Alternatively or additionally, substrate 110-2 may include a positive feature 116-2 defined on surface 112-2 of substrate 110-2, where positive feature 116-2 protrudes above a region 114-2 on surface 112-2 proximate to positive feature 116-2. Moreover, substrate 110-2 may include a mechanical reinforcement mechanism 118-2 defined on substrate 110-2 proximate to positive feature 116-2, where mechanical reinforcement mechanism 118-2 increases the shear strength of positive feature 116-2 relative to substrate 110-2. Furthermore, positive feature 116-2 may mate with optional negative feature 510-2 defined in a region 512-2 on surface 112-1 of substrate 110-1.

Figure 5B:
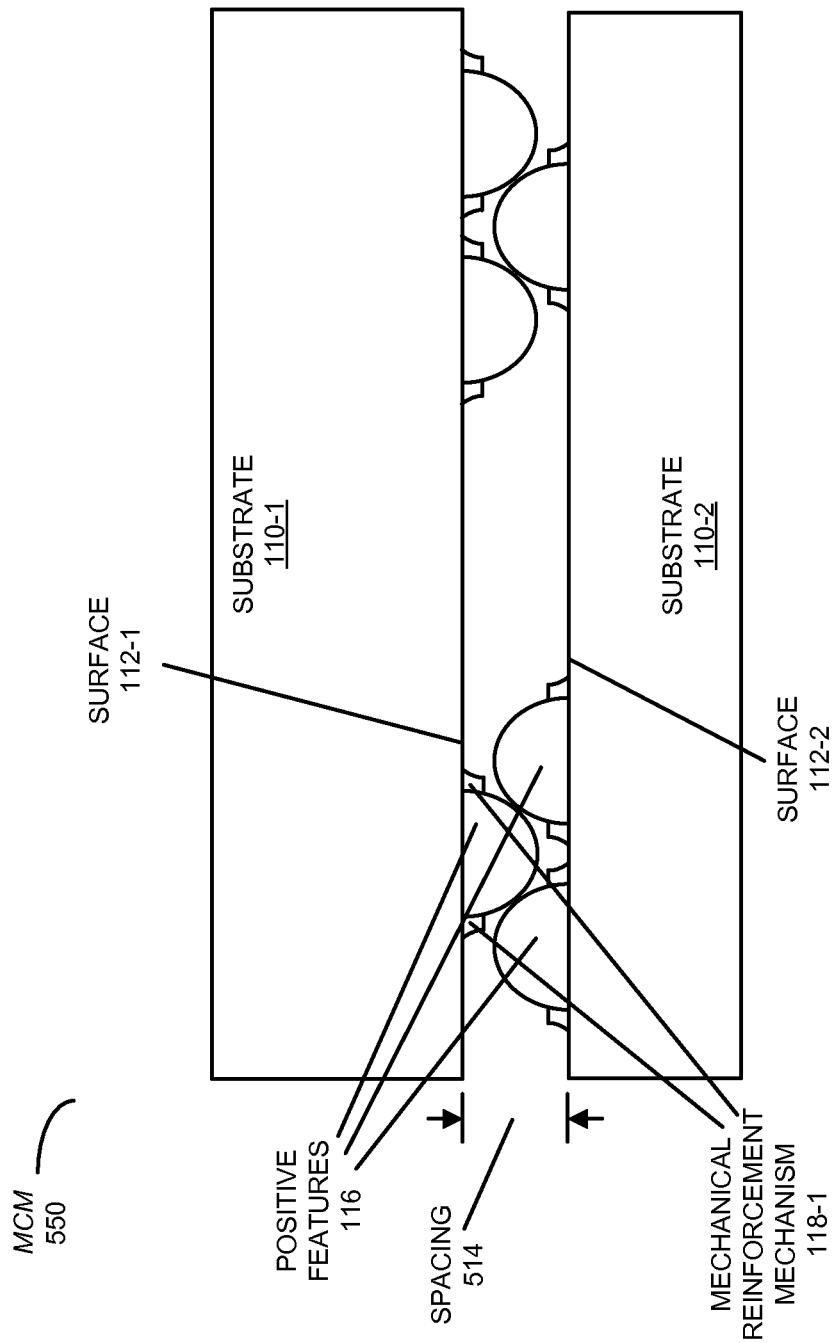
FIG. 5B is a block diagram illustrating a side view of an MCM in accordance with an embodiment of the present disclosure.

In some embodiments, alignment may be facilitated using only positive features 116. For example, positive features 116 may be positioned to mate so that their lateral positions are locked. This is shown in FIG. 5B, which presents a block diagram illustrating a side view of an MCM 550. Note that a constraint on spacing 514 in these embodiments can be avoided by using positive features 116 having low profiles, such as truncated hemispheres or truncated pyramids.

Referring back to FIG. 5A, thus MCM 500 may allow substrates 110 to be mechanically coupled to each other and/or a carrier (not shown) in a single assembly operation, which may facilitate fast, high-yield manufacturing without the use of expensive alignment and assembly equipment. Additionally, this assembly technique may facilitate alignment-sensitive communication between proximity connectors 516 on facing surfaces 112 of substrates 110. For example, the communication may include proximity communication, such as: optical proximity communication, capacitively coupled proximity communication of electrical signals, inductively coupled proximity communication, and/or conductively coupled proximity communication.

In some embodiments, components in MCM 500 are permanently attached after rematable alignment, for example, by using a post-alignment technique to permanently fix the chip-to-chip alignment. In particular, positive features 116 may be partially melted (for a photoresist, a glass or a polymer) or reflowed (for a metal) at an elevated temperature to fuse components in MCM 500 to create a more permanent bond.

Consequently, in some embodiments positive features 116 may include a material that can be reflowed during assembly of MCM 500 to align and rigidly mechanically couple two components in MCM 500. Alternatively or additionally, positive features 116 may include a material that can be partially melted during assembly of MCM 500 to align and rigidly mechanically couple two components in MCM 500. For example, positive features 116 may include a coating (not shown) with a reflow characteristic around a core (not shown). This coating may include a solder material, such as: a tin-lead alloy (with a 63%/37% or 5%/95% composition), a tin-gold-copper alloy, or a tin-indium alloy. These coatings may have a thickness of 1-10 tm or up to 10% of the diameter of positive features 116. Furthermore, the core may include a non-conducting material (such as a plastic, a polymer, polystyrene, divinylbenzene-copolymer, glass, ruby, sapphire, a ceramic, etc.) or a conducting material (such as stainless steel, a metal, copper, nickel, etc.). In some embodiments, the coating may include a wettable material, such as: a nickel-gold alloy, a chromium-copper-nickel-gold alloy, etc. Note that a metal coating may facilitate power transfer between substrates 110. Additionally, note that step-coverage problems or breakage in the metal coating can be controlled by reducing the slope of positive features 116 (in fact, this may serve a dual purpose of stabilizing the structure and providing additional shear strength while also providing metallic contact between substrates 110).

For example, thermal profile(s) used when reflowing or melting the coating on positive features 116 may be associated with a reflow or melting characteristic of a material(s) in the coating. For example, if the coating on positive features 116 includes a tin-based alloy, the peak temperature may be 260-270 C and the duration may be 1-2 minutes; if the coating includes a lead-based alloy, the peak temperature may be 200 C; and if the coating includes an indium-based alloy, the peak temperature may be 120 C.

Mating positive features 116 and/or optional negative features 510 can provide highly accurate self-alignment in an XY plane of substrates 110 (i.e., in the plane of surfaces 112), as well as co-planarity control, during the bonding. For example, the alignment over surfaces 112 may be within ±1 µm in the XY plane. Furthermore, reflowing at least the portion of the coatings and/or wettable material may also achieve alignment in the Z direction (i.e., out of the plane of the surfaces 112), thereby reducing the total bondline height in MCM 500 or bounding spacing 514 to between 1-10 µm.

Figure 6:
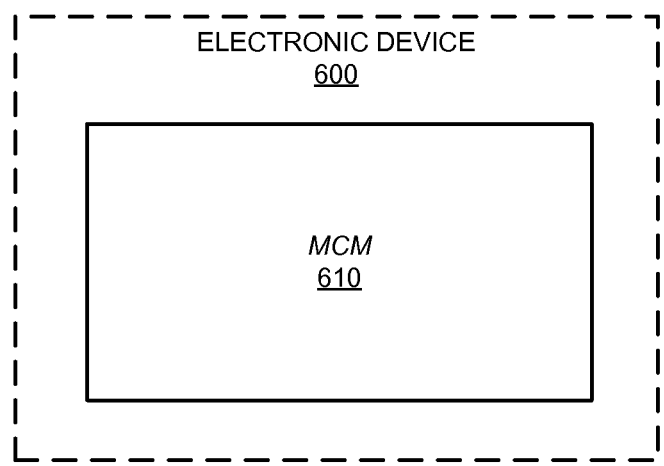
FIG. 6 is a block diagram illustrating an electronic device in accordance with an embodiment of the present disclosure.

Embodiments of the MCM may be used in a wide variety of applications, such as: a die stack in a memory application, flip-chip bonding and/or multi-layer stacks. A general application of an MCM is shown in FIG. 6, which presents a block diagram illustrating an electronic device 600. This electronic device includes MCM 610, which may include one or more of the chip packages in the preceding embodiments.

MCM 610 may include: VLSI circuits, communication systems (such as in wavelength division multiplexing), storage area networks, data centers, networks (such as local area networks), and/or computer systems (such as multiple processor-core computer systems). For example, an MCM may be included in a backplane that is coupled to multiple processor blades, or an MCM may couple different types of components (such as processors, memory, I/O devices, and/or peripheral devices). In some embodiments, an MCM performs the functions of: a switch, a hub, a bridge, and/or a router.

Note that electronic device 600 may include, but is not limited to: a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

The embodiments of the chip package, the MCM and/or the electronic device may include fewer components or additional components. Note that surfaces 112 (FIGS. 1-3, 5A and 5B) should be understood to include surfaces of substrates 110 (FIGS. 1-3, 5A and 5B) or surfaces of layers deposited on these substrates (such as a dielectric layer deposited on a substrate).

Furthermore, although the chip package, the MCM and the electronic device in the preceding discussion are illustrated as having a number of discrete items, these embodiments are intended to be functional descriptions of the various features that may be present rather than structural schematics. Consequently, in these embodiments two or more components may be combined into a single component, and/or a position of one or more components may be changed.

Additionally, note that components in the chip package and the MCM may be fabricated, and the MCM may be assembled, using a wide variety of techniques, as is known to one of skill in the art.

We now describe embodiments of the method. FIG. 7 presents a flow diagram 700 illustrating a method for increasing the shear strength in a chip package, such as one of the previous embodiments of the chip package. During this method, the positive feature is defined on the surface of the substrate in the chip package (operation 710), where the positive feature protrudes above the region on the surface proximate to the positive feature. Then, the mechanical reinforcement mechanism is fabricated on the substrate proximate to the positive feature (operation 712), where the mechanical reinforcement mechanism increases the shear strength of the positive feature relative to the substrate.

In some embodiments, method 700 includes additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
a substrate having a positive feature defined on a surface of the substrate, wherein the positive feature protrudes above a region on the surface proximate to the positive feature;
a layer of material defined on the surface; and
a mechanical reinforcement mechanism defined on the substrate proximate to the positive feature, wherein the mechanical reinforcement mechanism increases a shear strength of the positive feature relative to the substrate,
wherein the positive feature is located in an opening, defined by an edge, in the layer of material, and wherein the mechanical reinforcement mechanism is located in the opening between a side of the positive feature and the edge.

2. The chip package of claim 1, wherein the positive feature facilitates mechanical alignment between two components in a multi-chip module (MCM).

3. The chip package of claim 1, wherein the positive feature has one of: a hemispherical shape, a truncated hemispherical shape, a rectangular shape, a pyramidal shape, and a truncated pyramidal shape.

4. The chip package of claim 1, wherein the positive feature is fabricated on the substrate using an additive fabrication process.

5. The chip package of claim 1, wherein the mechanical reinforcement mechanism is located at a base of the positive feature at an interface with the substrate.

6. The chip package of claim 1, wherein the mechanical reinforcement mechanism is located around a circumference of the positive feature.

7. The chip package of claim 1, wherein the mechanical reinforcement mechanism includes a patterned metal that is reflowed so it conforms to a shape of the positive feature.

8. The chip package of claim 1, wherein the mechanical reinforcement mechanism includes a semiconductor.

9. The chip package of claim 1, wherein the layer of material includes a metal/dielectric stack.

10. The chip package of claim 1, wherein the mechanical reinforcement mechanism includes a cured material; and
wherein the material includes one of: an adhesive and an epoxy.

11. The chip package of claim 1, wherein the positive feature includes a material modifiable during assembly of an MCM to align and rigidly mechanically couple two components in the MCM; and
wherein the modification includes one of: reflowing and partial melting.

12. The chip package of claim 1, wherein the positive feature facilitates mechanical alignment between two components in an MCM using only positive features..

13. The chip package of claim 1, wherein the substrate includes one of: a semiconductor, an organic material, a ceramic, glass, and a plastic.

14. An MCM, comprising:
- a substrate having a positive feature defined on a surface of the substrate, wherein the positive feature protrudes above a region on the surface proximate to the positive feature;
- a second substrate that includes a negative feature defined on a second surface of the second substrate, wherein the positive feature facilitates mechanical alignment between the substrate and the second substrate; and
- a mechanical reinforcement mechanism defined on the substrate proximate to the positive feature, wherein the mechanical reinforcement mechanism increases a shear strength of the positive feature relative to the substrate,
- wherein the negative feature is recessed below a region on the second surface proximate to the negative feature, and wherein the positive feature mates with the negative feature.

15. The MCM of claim 14, wherein the second substrate includes:
- a second positive feature defined on a second surface of the second substrate, wherein the second positive feature protrudes above a region on the second surface proximate to the second positive feature; and
- a second mechanical reinforcement mechanism defined on the second substrate proximate to the second positive feature, wherein the second mechanical reinforcement mechanism increases a shear strength of the second positive feature relative to the second substrate; and
- wherein alignment between the substrate and the second substrate is facilitated by the positive feature and the second positive feature.

16. The MCM of claim 14, wherein the mechanical reinforcement mechanism is located at a base of the positive feature at an interface with the substrate.

17. The MCM of claim 14, wherein the mechanical reinforcement mechanism is located around a circumference of the positive feature.

* * * * *